(12) United States Patent
Zhang et al.

(10) Patent No.: US 8,920,947 B2
(45) Date of Patent: *Dec. 30, 2014

(54) MULTILAYER STRUCTURE WITH HIGH PERPENDICULAR ANISOTROPY FOR DEVICE APPLICATIONS

(75) Inventors: Kunliang Zhang, Fremont, CA (US); Min Li, Dublin, CA (US); Yuchen Zhou, San Jose, CA (US)

(73) Assignee: Headway Technologies, Inc., Milpitas, CA (US)

( * ) Notice: Subject to any disclaimer, the term of this patent is extended or adjusted under 35 U.S.C. 154(b) by 559 days.

This patent is subject to a terminal disclaimer.

(21) Appl. No.: 12/802,091

(22) Filed: May 28, 2010

(65) Prior Publication Data
US 2011/0293967 A1    Dec. 1, 2011

(51) Int. Cl.

| | |
|---|---|
| G11B 5/39 | (2006.01) |
| G01R 33/06 | (2006.01) |
| G11B 5/84 | (2006.01) |
| G01R 33/09 | (2006.01) |
| G11B 5/66 | (2006.01) |
| G11B 5/73 | (2006.01) |
| G11C 11/16 | (2006.01) |
| G11B 5/00 | (2006.01) |

(52) U.S. Cl.
CPC ............ *G11B 5/84* (2013.01); *G01R 33/098* (2013.01); *G11B 5/66* (2013.01); *G11B 5/732* (2013.01); *G11B 5/7325* (2013.01); *G11C 11/16* (2013.01); *G11B 5/3932* (2013.01); *G11B 2005/0024* (2013.01)
USPC ... 428/811.1; 365/158; 365/173; 360/125.31; 360/324.11; 360/324.12; 360/324.2

(58) Field of Classification Search
None
See application file for complete search history.

(56) References Cited

U.S. PATENT DOCUMENTS

| | | | |
|---|---|---|---|
| 6,999,286 B2 * | 2/2006 | Dieny et al. | 360/324.1 |
| 7,128,987 B2 * | 10/2006 | van de Veerdonk et al. | 428/828 |
| 7,175,925 B2 | 2/2007 | Chen et al. | |
| 7,279,240 B2 | 10/2007 | Nolan | |
| 7,479,394 B2 | 1/2009 | Horng et al. | |
| 7,862,912 B2 * | 1/2011 | Hellwig et al. | 428/828.1 |
| 7,936,539 B2 * | 5/2011 | Horng et al. | 360/324.1 |
| 8,008,740 B2 * | 8/2011 | Zhao et al. | 257/427 |

(Continued)

OTHER PUBLICATIONS

Mangin, S., Ravelosona, D., Katine, J., Carey, M., Terris, B. and Fullerton, E., Nature, vol. 5 (Mar. 2006), pp. 210-215.*

(Continued)

*Primary Examiner* — Kevin Bernatz
(74) *Attorney, Agent, or Firm* — Saile Ackerman LLC; Stephen B. Ackerman

(57) ABSTRACT

Perpendicular magnetic anisotropy and Hc are enhanced in magnetic devices with a Ta/M1/M2 seed layer where M1 is preferably Ti, and M2 is preferably Cu, and including an overlying $(Co/Ni)_X$ multilayer (x is 5 to 50) that is deposited with ultra high Ar pressure of >100 sccm to minimize impinging energy that could damage $(Co/Ni)_X$ interfaces. In one embodiment, the seed layer is subjected to one or both of a low power plasma treatment and natural oxidation process to form a more uniform interface with the $(Co/Ni)_X$ multilayer. Furthermore, an oxygen surfactant layer may be formed at one or more interfaces between adjoining $(Co/Ni)_X$ layers in the multilayer stack. Annealing at temperatures between 180° C. and 400° C. also increases Hc but the upper limit depends on whether the magnetic device is MAMR, MRAM, a hard bias structure, or a perpendicular magnetic medium.

11 Claims, 6 Drawing Sheets

(56) References Cited

U.S. PATENT DOCUMENTS

| | | | |
|---|---|---|---|
| 8,064,244 B2* | 11/2011 | Zhang et al. | 365/158 |
| 8,274,811 B2* | 9/2012 | Zhang et al. | 365/145 |
| 2004/0075957 A1* | 4/2004 | Li et al. | 360/324.11 |
| 2006/0017081 A1* | 1/2006 | Sun et al. | 257/295 |
| 2007/0111332 A1 | 5/2007 | Zhao et al. | |
| 2008/0170329 A1 | 7/2008 | Thangaraj et al. | |
| 2009/0015958 A1* | 1/2009 | Nakamura et al. | 360/55 |
| 2009/0021869 A1* | 1/2009 | Kamiguchi et al. | 360/324.1 |
| 2009/0257151 A1* | 10/2009 | Zhang et al. | 360/324.2 |
| 2010/0027161 A1* | 2/2010 | Takagishi et al. | 360/110 |
| 2010/0330395 A1* | 12/2010 | Zhang et al. | 428/813 |
| 2011/0096443 A1* | 4/2011 | Zhang et al. | 360/324.2 |

OTHER PUBLICATIONS

Mangin, S., Henry, Y., Davelosona, D., Katrine, J. and Fullerton, E., App. Phys. Let., 94 (2009), pp. 012502-1-012502-3.*

"Current-driven excitation of magnetic multilayers," by J.C. Slonczewski, Journal of Magnetism and Magnetic Materials 159 (1996) L1-L7, Elsevier.

"Microwave Assisted Magnetic Recording," by Jian-Gang Zhu et al., IEEE Transactions on Magnetics, vol. 44, No. 1, Jan. 2008, pp. 125-131.

"Current-induced magnetization reversal in nanopillars with perpendicular anisotropy," by S. Mangin et al., 2006 Nature Publishing Group, nature materials, vol. 5, Mar. 2006, www.nature.com/naturematerials, pp. 210-215.

"Low critical current for spin transfer in magnetic tunnel junctions," by Hao Meng et al., Applied Physics Letters 88, 082504 (2006), pp. 1-3.

"Temperature Dependence of Current-Incuded Magnetization Switching in Spin Valves with a Ferrimagnetic CoGd Free Layer," by Xin Jiang et al., Physical Review Letters, PRL 97, 217202 (2006), week ending Nov. 24, 2006, pp. 1-3, The American Physical Society.

"Spin-polarized current-induced magnetization reversal in perpendicularly magnetized L1o-FePt layers," by T. Seki et al., Applied Physics Letters 88, 172504 (2006), pp. 1-3, 2006 American Institute of Physics.

"Reducing the critical current for spin-transfer switching of perpendicularly magnetized nanomagnets," by S. Mangin et al., Applied Physics Letters 94, 012502 (2009), pp. 1-3, 2009 American Institute of Physics.

"Spin transfer switching in TbCoFe/CoFeB/MgO/CoFeB/TbCoFe magnetic tunnel junctions with perpendicular magnetic anisotropy," by Masahiko Nakayama et al., Journal of Applied Physics 103, 07A710 (2008), pp. 1-3, 2008 American Institute of Physics.

"Probabilistic behavior in subnanosecond spin transfer torque switching," by K. Ito et al., Journal of Applied Physics 99, 08G519 (2006), pp. 1-3, 2006 American Institute of Physics.

Co-pending U.S. Appl. No. 12/589,614, filed Oct. 26, 2009, "MTJ Incorporating CoFe/Ni Multilayer Film With Perpendicular Magnetic Anisotropy for MRAM Application," assigned to the same assignee as the present invention.

* cited by examiner

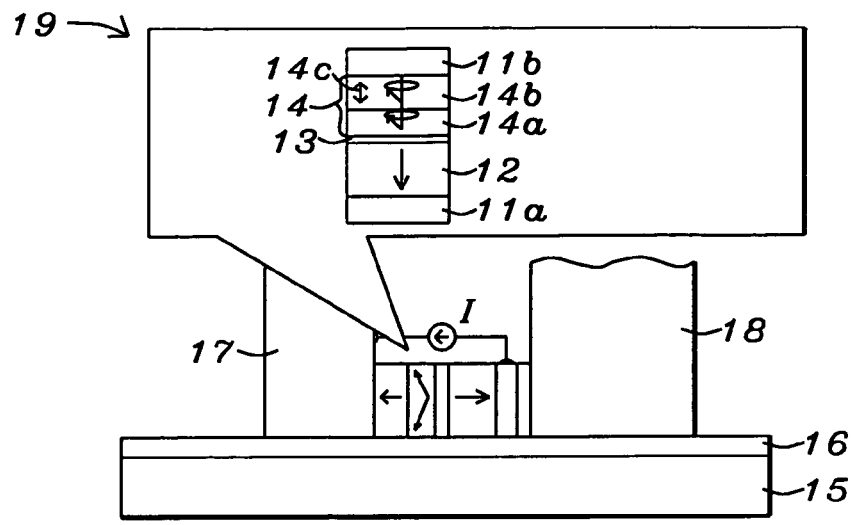
FIG. 1 - Prior Art
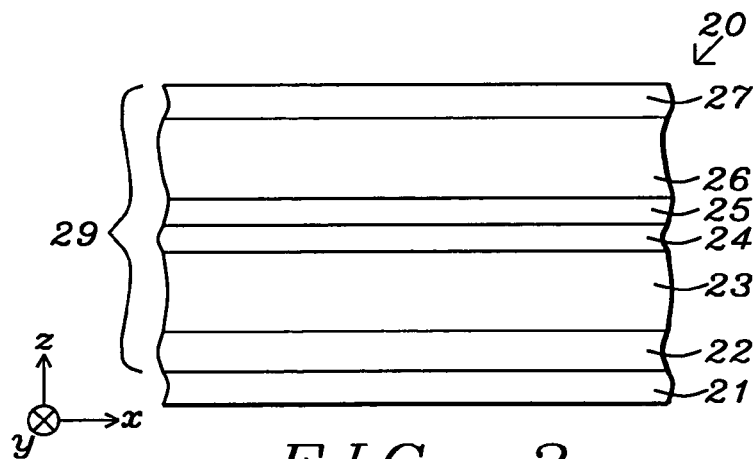
FIG. 2
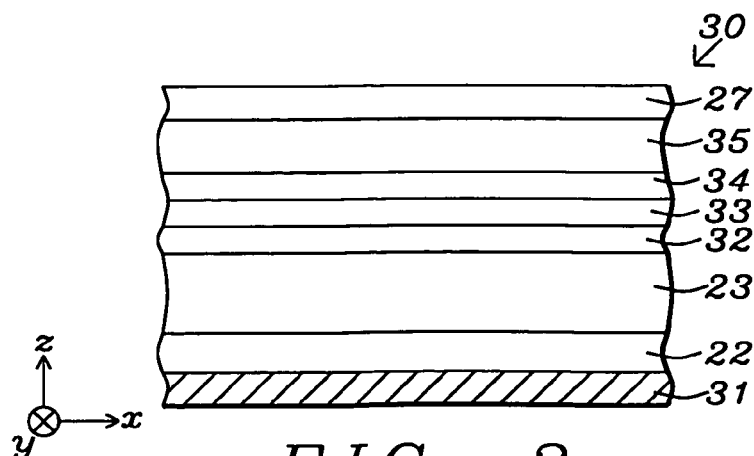
FIG. 3

MULTILAYER STRUCTURE WITH HIGH PERPENDICULAR ANISOTROPY FOR DEVICE APPLICATIONS

RELATED PATENT APPLICATIONS

This application is related to the following: U.S. Patent Application 2009/0257151; Ser. No. 12/456,935, filing date Jun. 24, 2009; and Ser. No. 12/589,614, filing date Oct. 26, 2009; assigned to the same assignee and herein incorporated by reference in their entirety.

FIELD OF THE INVENTION

The invention relates to a multilayer magnetic stack including a seed layer and a $(Co/Ni)_X$ or $(CoFe/Ni)_X$ laminate with high perpendicular magnetic anisotropy (PMA) and a method for making the same, and in particular, to increasing Hc such that the multilayer magnetic stack is equal to or better in performance compared with more costly $(Co/Pt)_Y$ and $(Co/Pd)_Y$ systems in a variety of device applications.

BACKGROUND OF THE INVENTION

Magnetoresistive Random Access Memory (MRAM), based on the integration of silicon CMOS with MTJ technology, is a major emerging technology that is highly competitive with existing semiconductor memories such as SRAM, DRAM, and Flash. Similarly, spin-transfer (spin torque or STT) magnetization switching described by C. Slonczewski in "Current driven excitation of magnetic multilayers", J. Magn. Magn. Mater. V 159, L1-L7 (1996), has recently stimulated considerable interest due to its potential application for spintronic devices such as STT-MRAM on a gigabit scale. Recently, J-G. Zhu et al. described another spintronic device called a spin transfer oscillator in "Microwave Assisted Magnetic Recording", IEEE Trans. on Magnetics, Vol. 44, No. 1, pp. 125-131 (2008) where a spin transfer momentum effect is relied upon to enable recording at a head field significantly below the medium coercivity in a perpendicular recording geometry.

Both MRAM and STT-MRAM may have a MTJ element based on a tunneling magneto-resistance (TMR) effect wherein a stack of layers has a configuration in which two ferromagnetic layers typically referred to as a pinned layer and free layer are separated by a thin non-magnetic dielectric layer. The MTJ element is typically formed between a bottom electrode such as a first conductive line and a top electrode which is a second conductive line at locations where the top electrode crosses over the bottom electrode in a MRAM device. In another aspect, a MTJ element in a read head sensor may be based on a giant magnetoresistance (GMR) effect that relates to a spin valve structure where a reference layer and free layer are separated by a metal spacer. In sensor structures, the MTJ is formed between two shields and there is a hard bias layer adjacent to the MTJ element to provide longitudinal biasing for stabilizing the free layer magnetization.

Materials with PMA are of particular importance for magnetic and magnetic-optic recording applications. Spintronic devices with perpendicular magnetic anisotropy have an advantage over MRAM devices based on in-plane anisotropy in that they can satisfy the thermal stability requirement and have a low switching current density but also have no limit of cell aspect ratio. As a result, spin valve structures based on PMA are capable of scaling for higher packing density which is one of the key challenges for future MRAM applications and other spintronic devices. Theoretical expressions predict that perpendicular magnetic devices have the potential to achieve a switching current lower than that of in-plane magnetic devices with the same magnetic anisotropy field according to S. Mangin et al. in Nat. Mater. 5, 210 (2006).

When the size of a memory cell is reduced, much larger magnetic anisotropy is required because the thermal stability factor is proportional to the volume of the memory cell. Generally, PMA materials have magnetic anisotropy larger than that of conventional in-plane soft magnetic materials such as NiFe or CoFeB. Thus, magnetic devices with PMA are advantageous for achieving a low switching current and high thermal stability. Several groups have studied spin transfer switching in GMR multilayers with perpendicular magnetic anisotropy and reported their results including the aforementioned S. Mangin publication as well as H. Meng et al. in "Low critical current for spin transfer in magnetic tunnel junctions", J. Appl. Phys. 99, 08G519 (2006), X. Jiang et al. in "Temperature dependence of current-induced magnetization switching in spin valves with a ferromagnetic CoGd free layer", Phys. Rev. Lett. 97, 217202 (2006), T. Seki et al. in "Spin-polarized current-induced magnetization reversal in perpendicularly magnetized $L1_0$-FePt layers", Appl. Phys. Lett. 88, 172504 (2006), and S. Mangin et al. in "Reducing the critical current for spin-transfer switching of perpendicularly magnetized nanomagnets", Appl. Phys. Lett. 94, 012502 (2009). However, in the GMR devices described in the prior art, typical switching current density is above 10 milli-amp/$cm^2$ which is too high for low switching current MRAM. Furthermore, the MR ratio is around 1% which is too small for the readout signal in MRAM. Therefore, improving the spin transfer switching performance in MTJ elements with PMA is extremely important for high performance MRAM applications.

There is a report by M. Nakayama et al. in "Spin transfer switching in TbCoFe/CoFeB/MgO/CoFeB/TbCoFe magnetic tunnel junctions with perpendicular magnetic anisotropy", J. Appl. Phys. 103, 07A710 (2008) on spin transfer switching in a MTJ employing a TbCoFe PMA structure. However, in a MTJ with a TbCoFe or FePt PMA layer, strenuous annealing conditions are usually required to achieve an acceptably high PMA value. Unfortunately, high temperatures are not so practical for device integration.

CoPt and its alloys such as CoCrPt and CoPt—$SiO_2$ are not desirable as PMA materials in spintronic devices because Pt and Cr are severe spin depolarizing materials and will seriously quench the amplitude of spintronic devices if incorporated in the spinvalve structures. Similarly, Co/Pd, and Co/Ir will not be good PMA materials for spintronic devices because of the severe spin depolarizing property of Pd and Ir. Furthermore, Co/Pt, Co/Pd, and Co/Ir configurations typically require a very thick and expensive Pt, Pd, or Ir as a seed layer. Au is associated with high cost and easy interdiffusion to adjacent layers which makes a Co/Au multilayer for PMA purposes less practical.

PMA materials have been considered for microwave assisted magnetic recording (MAMR) as described by J-G. Zhu et al. in "Microwave Assisted Magnetic Recording", IEEE Trans. on Magn., Vol. 44, No. 1, pp. 125-131 (2008). A mechanism is proposed for recording at a head field significantly below the medium coercivity in a perpendicular recording geometry. FIG. 1 is taken from the aforementioned reference and shows an ac field assisted perpendicular head design. The upper caption 19 represents a perpendicular spin torque driven oscillator for generating a localized ac field in a microwave frequency regime and includes a bottom electrode 11a, top electrode 11b, perpendicular magnetized reference layer 12 (spin injection layer), metallic spacer 13, and oscillating stack 14. Oscillator stack 14 is made of a field generation layer 14a and a layer with perpendicular anisotropy 14b having an easy axis 14c. The ac field generator in the upper caption 19 is rotated 90 degrees with respect to the lower part of the drawing where the device is positioned between a write pole 17 and a trailing shield 18. The writer moves across the surface of a magnetic media 16 that has a soft underlayer 15. The reference layer 12 provides for spin polarization of injected current (I). Layers 14a, 14b are ferromagnetically exchanged coupled. Improved materials for the reference layer and oscillator stack are needed as this technology matures.

In other prior art references, U.S. Patent Application Pub. 2008/0170329 discloses a seed layer selected from alloys of Cu or Ta and Ti, and also describes a heat treatment to improve underlayer smoothness in a perpendicular magnetic recording medium.

U.S. Pat. No. 7,128,987 describes a perpendicular magnetic medium with each laminated layer consisting of a composite wherein a discontinuous magnetic phase is surrounded by a non-magnetic phase. Fabrication methods may involve a heat treatment or an unspecified surface treatment of the composite layer.

In U.S. Pat. No. 7,175,925, a seed layer comprised of Ta or Cu is used between a magnetically soft underlayer and a crystalline interlayer in a perpendicular magnetic recording medium.

U.S. Pat. No. 7,279,240 teaches a seed layer of Ti or Cu for a laminated perpendicular magnetic recording medium.

However, none of the aforementioned references suggest a high performance, low cost PMA alternative to the commonly used $(Co/Pt)_Y$ and $(Co/Pd)_Y$ multilayer stacks in the prior art. A low cost multilayer with high PMA and high Hc is needed to enable PMA materials to be more widely accepted in a variety of magnetic device applications.

SUMMARY OF THE INVENTION

One objective of the present invention is to provide a multilayer stack including a seed layer and a $(Co/Ni)_X$ or $(CoFe/Ni)_X$ laminate formed thereon that has a Hc value substantially greater than 1000 Oe to provide a high performance, low cost alternative to $(Co/Pt)_Y$ and $(Co/Pd)_Y$ PMA multilayers in magnetic devices such as MRAM, MAMR, and sensors.

A second objective of the present invention is to provide a $(Co/Ni)_X$ or $(CoFe/Ni)_X$ multilayer stack with a higher spin polarizing effect and greater Mst than previously achieved in other PMA structures.

These objectives are achieved according to the present invention by a stack comprised of a composite seed layer that has a modified top surface to provide enhanced smoothness and an improved interface with an overlying $(Co/Ni)_X$ or $(Co_ZFe_{(100-Z)}/Ni)_X$ multilayer where x is from 5 to 50 and z is from 10 to 100 atomic %. Preferably, the composite seed layer is Ta/Ti/Cu where the lower Ta layer contacts a substrate and the Cu layer is the uppermost layer. In one aspect, the seed layer is subjected to a plasma treatment with an inert gas to provide a smoother surface on which the $(Co/Ni)_X$ or $(Co_ZFe_{(100-Z)}/Ni)_X$ multilayer stack is deposited. Alternatively, the top surface of the seed layer is subjected to a plasma treatment followed by formation of a thin oxygen surfactant layer. In yet another embodiment, only a natural oxidation of the seed layer top surface is performed to generate a smooth surface on which to deposit the $(Co/Ni)_X$ or $(Co_ZFe_{(100-Z)}/Ni)_X$ multilayer stack. Improved interfaces between the Co and Ni or CoFe and Ni layers in the PMA laminate is achieved by employing a low energy, high pressure deposition process to minimize the energy that impinges on the surface of a Co, CoFe, or Ni layer thereby improving the interface with a subsequently deposited layer. Furthermore, in the $(Co/Ni)_X$ or $(Co_ZFe_{(100-Z)}/Ni)_X$ multilayer stack, one or more of the Co/Ni or CoFe/Ni layers may be treated with a natural oxidation process to form an oxygen surfactant layer (OSL) before a subsequent Co/Ni or CoFe/Ni layer is laid down.

In a first embodiment, the stack comprising a lower seed layer and an upper $(Co/Ni)_X$ or $(Co_ZFe_{(100-Z)}/Ni)_X$ multilayer in which at least the top surface of the seed layer has been modified by a plasma treatment or oxidized to form an OSL is formed in a MAMR configuration. Furthermore, one or more OSL may be formed in the $(Co/Ni)_X$ or $(Co_ZFe_{(100-Z)}/Ni)_X$ multilayer. Optionally, one or more OSL are formed in the PMA multilayer stack but not on the seed layer. The MAMR device may have a configuration represented by seed/PMA multilayer/interfacial layer/spacer/FGL/cap layer where FGL is the field generation layer. The interfacial layer and FGL may be made of FeCo while the spacer is Cu or the like in a GMR embodiment or a tunnel barrier layer such as MgO, AlOx, TiOx, or ZnO in a TMR configuration.

According to a second embodiment, the seed layer/PMA multilayer stack described above with regard to the first embodiment may be employed in a MRAM device. For example, a MTJ structure may comprise a seed layer/PMA multilayer/interfacial layer/spacer/interfacial layer/free layer/cap layer where the spacer is a tunnel barrier layer made of MgO or the like. Preferably, the seed layer contacts a substrate which is a bottom electrode and the cap layer contacts a bit line or word line.

In a third embodiment relating to a sensor structure, the seed layer/PMA multilayer stack described previously may serve as a hard bias structure adjacent to a MTJ element. Preferably, x is between 10 and 40 in the $(Co/Ni)_X$ or $(Co_ZFe_{(100-Z)}/Ni)_X$ multilayer to produce the desired Mrt. A capping layer may be formed directly on the top surface of the PMA multilayer stack.

There is a fourth embodiment relating to a magnetic medium. The seed layer/PMA stack may be deposited on an underlayer or substrate and may have a capping layer formed on the top surface of the PMA multilayer stack as in the third embodiment. In this case, the Ti layer thickness in the composite seed layer may be increased to provide a higher Hc, and x is increased to a range of 20 to 60 in the $(Co/Ni)_X$ or $(Co_ZFe_{(100-Z)}/Ni)_X$ laminate.

BRIEF DESCRIPTION OF THE DRAWINGS

FIG. 1 is a schematic illustration of a MAMR recording head with an ac field assisted perpendicular head design according to a prior art reference.

FIG. 2 is cross-sectional view of a seed layer/PMA multilayer stack that is formed in a MAMR device according to a first embodiment of the present invention.

FIG. 3 is a cross-sectional view of a seed layer/PMA multilayer stack that is formed in a MRAM structure according to a second embodiment of the present invention.

DETAILED DESCRIPTION OF THE INVENTION

Figure 4:
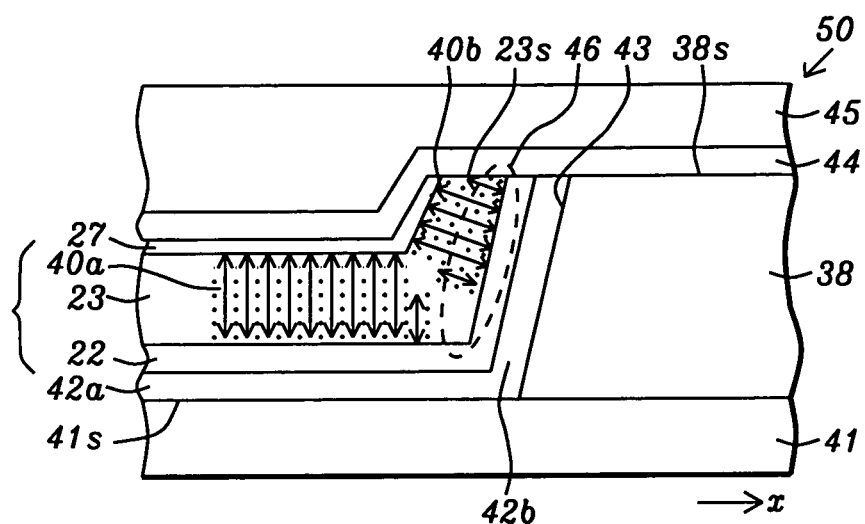
FIG. 4 is a cross-sectional view of a seed layer/PMA multilayer stack formed as a hard bias structure in a sensor according to a third embodiment of the present invention.

The present invention is a multilayer stack comprised of a seed layer and an overlying $(Co/Ni)_X$ or $(Co_ZFe_{(100-Z)}/Ni)_X$ laminate that provides high PMA in a magnetic device including MAMR, MRAM, sensors, and magnetic media as described in the various embodiments. The present invention also includes various methods of enhancing the Hc value of a $(Co/Ni)_X$ or $(Co_ZFe_{(100-Z)}/Ni)_X$ laminate. Although the exemplary embodiments depict a bottom spin torque oscillator (STO) for MAMR and bottom spin valve for MRAM, those skilled in the art will appreciate that the high PMA multilayer stack as described herein may also be incorporated in a top STO structure, or in a top spin valve or dual spin valve configuration in a MRAM device.

In related U.S. Patent Application 2009/0257151, we disclosed the advantages of Co/Ni multilayer structures having PMA in MRAM applications in which the magnetic anisotropy of a $(Co/Ni)_X$ laminated structure where x=5 to 50 arises from the spin-orbit interactions of the 3d and 4s electrons of Co and Ni atoms. Such interaction causes the existence of an orbital moment which is anisotropic with respect to the crystal axes which are in (111) alignment, and also leads to an alignment of the spin moment with the orbital moment. Similar PMA behavior was described for $(Co_ZFe_{(100-Z)}/Ni)_X$ and related laminated structures in patent application Ser. No. 12/589,614. PMA is improved by using a composite seed layer with a Ta/M1/M2 or Ta/M1 configuration where M1 is a metal or alloy having a fcc(111) or (hcp) hexagonal closed packed (001) crystal orientation such as Ru, Ti, Zr, Hf, NiCr, NiFeCr or the like, and M2 is Cu, Ti, Pd, W, Rh, Au, or Ag where M2 is unequal to M1. The Ta, M1, and M2 layers in the composite seed layer are critical for enhancing the (111) texture in overlying layers. In particular, a Ta/Ti/Cu seed layer was found to be especially effective in enhancing PMA and Hc in overlying multilayer stacks.

Multilayer stacks comprised of $(Co/Ni)_X$ or $(Co_ZFe_{(100-Z)}/Ni)_X$ laminates, or the like have superior properties over conventionally used $(Co/Pt)_Y$ and $(Co/Pd)_Y$ systems such as higher spin polarization, much lower cost of ownership, and higher Mst for certain applications including hard bias (HB) layers. However, $(Co/Ni)_X$ or $(Co_ZFe_{(100-Z)}/Ni)_X$ laminates suffer from an intrinsic low Hc compared with $(Co/Pt)_Y$ and $(Co/Pd)_Y$ systems. As a result, a low Hc value has been preventing $(Co/Ni)_X$ or $(Co_ZFe_{(100-Z)}/Ni)_X$ laminates from being widely incorporated in device applications due to insufficient robustness against stray magnetic fields. Thus, we were motivated to significantly improve PMA and Hc for $(Co/Ni)_X$, $(Co_ZFe_{(100-Z)}/Ni)_X$, and related laminates. Since the intrinsic PMA of the aforementioned multilayer stacks originates from interfacial spin-orbit interactions of the 3d and 4s electrons of Co (or CoFe) and Ni atoms, a method is needed to further improve the interfaces between adjoining layers in the $(Co/Ni)_X$ and $(Co_ZFe_{(100-Z)}/Ni)_X$ multilayers. In a $(Co/Ni)_X$ multilayer, for example, there are "x−1" interfaces.

We have discovered three methods for increasing PMA and Hc in seed layer/$(Co/Ni)_X$ and seed layer/$(Co_ZFe_{(100-Z)}/Ni)_X$ multilayer stacks that may be used separately or in combination with one another. Various embodiments where the high PMA multilayer stacks fabricated by these methods are incorporated into magnetic devices and magnetic media will be described.

Referring to FIG. 2, one embodiment of the present invention relates to a MAMR structure. A cross-sectional view of a bottom type (SIL layer on the bottom) MAMR structure 20 is depicted and has a seed layer 22, PMA multilayer also referred to as a reference layer or spin injection layer (SIL) 23, interfacial layer 24, spacer layer 25, field generation layer (FGL) 26, and cap layer 27 sequentially formed on a substrate 21 that may serve as a first electrode. Preferably, the seed layer 22 has a Ta/Ti/Cu configuration although other materials as described in related patent application Ser. No. 12/589,614 are also acceptable. In one aspect, the lower Ta layer contacting the substrate has a thickness from 5 to 50 Angstroms, and preferably 10 Angstroms, the Ti layer has a thickness from 5 to 50 Angstroms, and preferably 30 Angstroms, and the Cu layer has a thickness between 5 and 50 Angstroms, and preferably 20 to 30 Angstroms.

We have found that seed layer 22 smoothness is significantly improved by performing a plasma treatment (PT) prior to deposition of the SIL 23. It is believed that the plasma treatment reduces surface topography with a loss of less than about 5 Angstroms from the uppermost layer in the composite seed layer. According to one embodiment, the PT process comprises an inert gas such as Ar with a flow rate from 15 to 450 standard cubic centimeters per minute (sccm), and a power less than 200 Watts during a period of 10 to 100 seconds. As a result, an improved interface will be formed with a subsequently deposited (Co/Ni) or (CoFe/Ni) layer in the SIL 23.

Furthermore, a second surface treatment may be performed after the plasma treatment to contribute to the formation of a smoother seed layer 22 surface. In particular, a very thin oxygen surfactant layer (OSL) believed to have a thickness less than or equal to about one atomic layer is formed on the seed layer surface following the plasma treatment. Essentially, the OSL formation is achieved by a natural oxidation (NOX) process in which oxygen is introduced into a process chamber at flow rate of 0.01 to 0.2 sccm for a period of 1 to 200 seconds. According to one embodiment, the PT process is performed in a sputter etch chamber within a sputter deposition mainframe and the NOX process is accomplished in an oxidation chamber within the same sputter deposition mainframe to enhance throughput.

Alternatively, either the PT process or the NOX process may be used as a single method of treating the seed layer 22 to improve smoothness before deposition of SIL 23. However, as indicated in a later section by Hc data from experimental samples, the combination of the two treatments is usually capable of generating a higher Hc value than a single PT or NOX treatment.

Above the composite seed layer 22 is a reference (SIL) layer 23 that has a $(Co/Ni)_X$ or $(Co_{(100-Z)}Fe_Z/Ni)_X$ laminated structure where z is from 0 to 90 and x is between 5 and 50, and preferably, between 10 and 30. Each of the plurality of Co or CoFe layers in the laminated reference layer 23 has a thickness (t1) from 0.5 to 5 Angstroms, and preferably between 1.5 to 3 Angstroms. Each of the plurality of Ni layers in the laminated reference layer has a thickness (t2) from 2 to 10 Angstroms, and preferably between 3.5 and 8 Angstroms. Preferably, the thickness t2 of a Ni layer is greater than a Co or CoFe layer thickness t1, and more preferably, t2~2× t1 in order to optimize the spin orbit interactions between adjacent Co and Ni layers, or between CoFe and Ni layers. In one aspect, when t1 is less than or equal to about 2 Angstroms, the Co or CoFe layer may be considered as a "close-packed" layer and not necessarily having a (111) crystal orientation.

The present invention also encompasses an embodiment wherein the laminated SIL 23 has a composition represented by $[Co(t1)/NiFe(t2)]_X$, $[Co(t1)/NiCo(t2)]_X$, $[CoFe(t1)/NiFe(t2)]_X$, or $[CoFe(t1)/NiCo(t2)]_X$ where the Co and Fe content in the NiCo and NiFe layers, respectively, is from 0 to 50 atomic %. Alternatively, the laminated SIL 23 may be comprised of $(CoFeR/Ni)_X$ where R is a metal such as Ru, Rh, Pd, Ti, Zr, Hf, Ni, Cr, Mg, Mn, or Cu. Preferably, the R content in the CoFeR alloy is less than 10 atomic % and a CoFeR layer has a t1 thickness.

We have discovered another method of improving Hc in a seed layer/PMA multilayer stack comprised of a $(Co/Ni)_X$ or $(Co_{(100-Z)}Fe_Z/Ni)_X$ laminate. In an earlier application, a low power, high pressure deposition method for $(Co/Ni)_X$ was employed to preserve the interfaces between Co and Ni layers. During subsequent development efforts, we have found that increasing the pressure to substantially greater than 100 sccm has an important role in yielding a significant enhancement of Hc. Thus, an ultra high Ar pressure of between 100 and 500 sccm during $(Co/Ni)_X$ or $(Co_{(100-Z)}Fe_Z/Ni)_X$ deposition causes Hc to be increased up to 30% or more.

Moreover, the NOX treatment described previously may be employed to improve the surface of one or more of the (Co/Ni) or (CoFe/Ni) layers in a PMA multilayer stack. Therefore, the OSL formed by a NOX process improves the interface not only between a composite seed layer and a (Co/Ni) or (CoFe/Ni) layer, but also between adjacent (Co/Ni) layers or between adjacent (CoFe/Ni) layers in a PMA multilayer stack. It should be understood that it is not necessary to perform a NOX process on each (Co/Ni) layer in a $(Co/Ni)_X$ multilayer to reach a desirable Hc. In one aspect, only every $n^{th}$ (Co/Ni) layer (where n is an integer >1) is treated before a subsequent (Co/Ni) layer is laid down. Note that a NOX process may be performed on either a Co (or CoFe) layer or a Ni layer. In other words, the process sequence for fabricating a (Co/Ni) layer may be Co deposition/NOX/Ni deposition or Co deposition/Ni deposition/NOX.

According to the present invention, at least one surface modification treatment involving a PT process or a NOX process on the composite seed layer, or a NOX process on one or more layers in the PMA multilayer is performed to improve a seed layer/PMA multilayer interface or to improve an interface between adjacent (Co/Ni) layers or adjacent (CoFe/Ni) layers in the PMA multilayer structure. In another embodiment, an ultra high Ar pressure is used during $(Co/Ni)_X$ or $(Co_{(100-Z)}Fe_Z/Ni)_X$ deposition to enhance Hc in a magnetic device comprising a composite seed layer/PMA multilayer configuration. The ultra high pressure further minimizes the impinging energy on a Co (or CoFe) or Ni surface thereby preserving the interface formed between adjoining Co and Ni layers, or between adjoining CoFe and Ni layers. In yet another embodiment, one or more PT or NOX surface modification techniques may be used in combination with ultra high pressure deposition of (Co/Ni) or (CoFe/Ni) layers in a PMA multilayer.

Above the laminated SIL 23 is a first interfacial layer 24 that serves to promote uniform growth in the overlying spacer layer 25 for higher spin polarization. In one aspect, the first interfacial layer is a ferromagnetic layer comprised of CoFeB with a thickness of 5 to 20 Angstroms. Alternatively, the first interfacial layer 24 may be a CoFeB/CoFe composite (not shown) with a lower CoFeB layer having a thickness from 5 to 20 Angstroms that contacts the laminated reference layer 23 and an upper CoFe layer having a thickness from 2 to 8 Angstroms that contacts the spacer layer 25. The upper CoFe layer may have the same Fe content as the $Co_{(100-Z)}Fe_Z$ layer in the laminated reference layer 23. Optionally, the first interfacial layer 24 may have a CoFe/CoFeB configuration.

There is a non-magnetic spacer layer 25 formed on the first interfacial layer 24. The spacer layer may be comprised of Cu or another high conductivity metal or metal alloy in a GMR embodiment. The present invention also anticipates a GMR embodiment having a current confining path (CCP) structure in which a dielectric layer with metal paths therein is sandwiched between two metal layers (i.e. Cu) as appreciated by those skilled in the art. Alternatively, the spacer layer 25 may be comprised of a dielectric material such as MgO, AlOx, TiOx, ZnO, or other metal oxides or metal nitrides in a TMR configuration.

A second interfacial layer (not shown) may be formed on the spacer layer 25 to promote higher spin polarization in the spin transfer oscillator (STO) and is a ferromagnetic layer made of CoFeB or a CoFe/CoFeB composite layer with a lower CoFe layer contacting the spacer layer and an upper CoFeB layer contacting the overlying FGL 26. The second interfacial layer may have the same thickness for the CoFeB and CoFe layers as in the first interfacial layer 24. Optionally, as illustrated in the exemplary embodiment, the FGL 26 may be formed directly on the spacer layer 25.

In one embodiment, the FGL 26 is a magnetic (ferromagnetic) layer such as FeCo or the like and functions as an oscillator layer having a magnetic moment that is capable of switching from one direction along an easy axis (not shown) to an opposite direction when sufficient spin torque is applied. SIL 23 is ferromagnetically coupled to field generation layer 26. Alternatively, the FGL may have a $(Co/Ni)_S$ or $(Co_{(100-Z)}Fe_Z/Ni)_S$ laminated composition where z is from 0 to 90 atomic % and s is from 3 to 10, and preferably between 3 and 5. In one aspect, the value for z selected in the FGL 26 is the same value for z as used in the laminated SIL 23. However, the Co content in the FGL laminate may be different than the Co content in the SIL laminate without sacrificing any benefits provided by the seed layer/PMA multilayer stack of the present invention. Note that a laminated FGL 26 does not require a separate seed layer to establish PMA and may have a crystal structure other than the (111) orientation in the laminated SIL 23.

The uppermost layer in the MAMR structure 20 is a composite capping layer 27. In one aspect, the capping layer 27 has a Ru/Ta/Ru configuration where the upper Ru layer is used to provide oxidation resistance and excellent electrical contact to an overlying second electrode (not shown). Optionally, other capping layer materials used in the art may be selected as capping layer 27.

According to the present invention, a method of forming a seed layer/PMA multilayer stack as defined herein also includes an annealing step after the capping layer 27 has been deposited. The annealing process comprises a temperature in the range of 150° C. to 300° C., and preferably between 180° C. and 250° C. for a period of 0.5 to 5 hours. Thereafter, the MAMR structure may be patterned by a well known method to form a plurality of MAMR elements on substrate 21. Experimental data in a later section demonstrates that annealing may further increase Hc by a significant amount.

Figure 11:
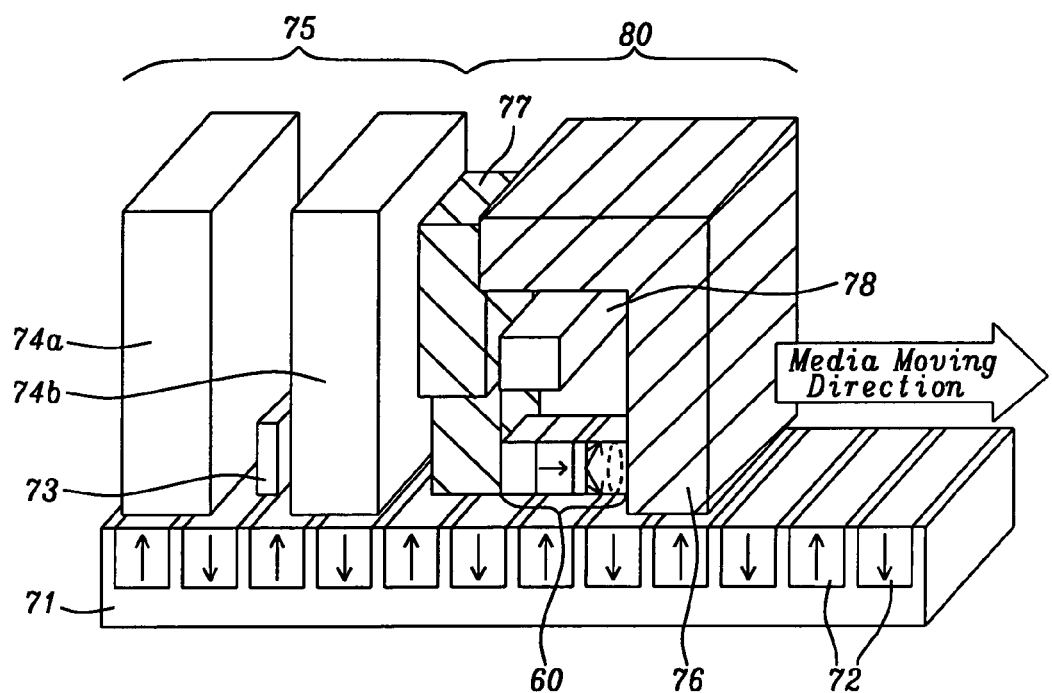
FIG. 11 is a cross-section of a spin transfer oscillator structure having a "top" STO configuration that includes a seed layer/PMA multilayer stack according to an embodiment of the present invention.

Referring to FIG. 11, spin transfer oscillator (STO) 29 shown in FIG. 2 may be formed in a write head 80. In the exemplary embodiment, the STO writer 80 is pictured as part of a merged read-write head where the read head 70 includes top and bottom shields 74a, 74b, and a sensor 73 between the aforementioned shields. STO writer 80 is comprised of a main pole 76, a trailing shield 77 and a wire 78 for injecting current into the spin transfer oscillator structure 29 which is shown in a "top" STO configuration. The "top" STO configuration has a laminated reference layer proximate to the main pole layer 76 and with a magnetization aligned in the same direction as the media moving direction. Note that the oscillator (FGL) layer is formed closer to the first electrode (trailing shield 77) than the reference (SIL) layer and has a magnetization direction which is free to rotate as indicated by the layer with two arrows and a dotted circle in imbedded structure 29.

In an alternative embodiment (not shown), the positions of the FGL layer 26 and SIL layer 23 in STO structure 29 may be switched to give a "bottom" STO configuration as appreciated by those skilled in the art.

Referring to FIG. 3, a MRAM 30 is depicted that incorporates a seed layer/PMA multilayer stack formed according to an embodiment of the present invention. In this case, substrate 31 may be a bottom electrode layer. In the exemplary embodiment, a bottom spin valve structure is shown wherein a seed layer 22, PMA multilayer 23 that serves as a reference layer, first interfacial layer 32, tunnel barrier 33, second interfacial layer 34, free layer 35, and capping layer 27 are sequentially formed on the substrate 31. Seed layer 22 and reference layer 23 may be comprised of the same materials and fabricated by the same methods as previously described in the MAMR embodiments.

The first interfacial layer 32 serves to promote uniform growth in the overlying tunnel barrier layer 33 for higher spin polarization and is a ferromagnetic layer comprised of CoFeB, for example, with a thickness of 5 to 20 Angstroms. Alternatively, the first interfacial layer 32 may be a CoFeB/CoFe composite (not shown) with a lower CoFeB layer having a thickness from 5 to 20 Angstroms that contacts the laminated reference layer 23 and an upper CoFe layer having a thickness from 2 to 8 Angstroms that contacts the tunnel barrier layer 25. In another embodiment, the first interfacial layer 32 may have a CoFe/CoFeB configuration.

The tunnel barrier layer 33 formed on the first interfacial layer 32 is preferably made of MgO although other non-magnetic tunnel barrier materials used in the art such as AlOx, TiOx, and ZnO may be employed. As described in U.S. Patent Application Publications 2007/0111332 and 2007/0148786 by Headway, a MgO layer may be fabricated by depositing a first Mg layer on a reference layer or in this case on an interfacial layer contacting a reference layer, then performing a natural oxidation process, and finally depositing a second Mg layer on the oxidized first Mg layer. During a subsequent annealing process, the tunnel barrier layer 25 becomes essentially a uniform MgO layer.

Preferably, a second interfacial layer 34 is formed on the tunnel barrier layer 33 to promote higher spin polarization within the MRAM stack of layers. According to one embodiment, the second interfacial layer 34 has the same material composition and thickness as described for the first interfacial layer 32. Thus, CoFeB, CoFeB/CoFe, and CoFe/CoFeB configurations are desirable for the second interfacial layer.

In the exemplary embodiment, there is a free layer 35 formed on the second interfacial layer 34. In one aspect, the free layer may be comprised of CoFe, CoFeB, or combinations thereof. Alternatively, the free layer may have a CoFe/NiFe configuration. In yet another embodiment, the free layer 35 may have a laminated structure comprised of $(Co/Ni)_S$, $(Co_{(100-Z)}Fe_Z/Ni)_S$, $(CoFe/NiFe)_S$, $(Co/NiFe)_S$, $(Co/NiCo)_S$, or $(CoFe/NiCo)_S$ where z is from 0 to 90 atomic % and s is from 3 to 10, and preferably between 3 and 5. The present invention also encompasses an embodiment wherein the free layer 35 may be omitted and the second interfacial layer 34 serves as the free layer. Accordingly, the thickness of the second interfacial layer 34 may be adjusted to optimize the magnetic properties of the resulting spin valve structure in MRAM 30.

The uppermost layer in the spin valve stack is a composite capping layer 27. In one aspect, the capping layer 27 has a Ru/Ta/Ru configuration where the upper Ru layer is used to provide oxidation resistance and excellent electrical contact to an overlying top electrode (not shown). A substantial reduction in critical current density (Jc) occurs in STT-MRAM applications when a thin Ru layer is employed as a capping layer due to the strong spin scattering effect of Ru. Critical current density (Jc) is preferably about $10^6$ A/cm$^2$ to be viable for spin-transfer magnetization switching in the 90 nm technology node and beyond. Higher values could destroy a thin tunnel barrier made of AlOx, MgO, or the like. The Ta layer may be included to offer etch resistance in subsequent processing steps. Optionally, other capping layer materials used in the art may be selected as capping layer 27.

Once all of the layers in the MRAM stack are formed, an annealing process may be performed that is comprised of a temperature between 220° C. and 400° C., and preferably between 250° C. and 360° C., for a period of 2 to 5 hours. Thereafter, the MRAM stack may be fabricated by a well known patterning and etch sequence to produce a plurality of MRAM cells on the substrate 31. In one embodiment, the bottom electrode 31 is patterned simultaneously with the MRAM stack so there is a bottom electrode formed below each MRAM cell in an MRAM array.

Referring to FIG. 4, a seed layer/PMA multilayer as defined herein is incorporated in a hard bias structure to stabilize a sensor according to a third embodiment of the present invention. A sensor stack 38 in a read head structure 50 is shown as viewed from an air bearing surface (ABS) plane. A bottom shield 41 made of permalloy, for example, is formed on a substrate (not shown) that is typically ceramic and a patterned spin valve element (sensor) is formed on the bottom shield by a well known method. The sensor may have a bottom spin valve, top spin valve, or dual spin valve configuration including a free layer. Each of the layers in the sensor has a top surface formed in a plane that is parallel to the top surface 41s of the bottom shield. The sensor has a top surface 38a and a sidewall 43 that is fabricated by a conventional method which is not described herein. From a top-down view (not shown), the top surface 38a of the sensor may appear as a circle, ellipse, or a polygonal shape.

There is an isolation layer made of AlOx or another dielectric material having a section 42a formed on the bottom shield 41, and a section 42b along sidewall 43. Composite seed layer 22 is formed on isolation layer sections 42a, 42b and is preferably comprised of Ta/Ti/Cu although other configurations as described previously may be used.

Above the composite seed layer 22 is a PMA multilayer 23 that serves as a hard bias layer and preferably has a $(Co/Ni)_X$, $(Co_{(100-Z)}Fe_Z/Ni)_X$, $(CoFe/NiFe)_X$, $(Co/NiFe)_X$, $(Co/NiCo)_X$, or $(CoFe/NiCo)_X$ structure with high PMA as defined in previous embodiments. Arrows 40a represent the easy axis of HB grains formed on the seed layer 22 above isolation layer section 42a and arrows 40b represent the easy axis of HB grains formed on the seed layer above isolation layer section 42b. With the easy axes 40a, 40b oriented perpendicular to the underlying seed layer 22, initialization of the HB layer 23 can be achieved by applying a strong in-plane longitudinal field along the x-axis direction (left to right) that overcomes the anisotropy field of the HB material and aligns the HB magnetization in the same direction as the applied field. Once the field is withdrawn, the magnetizations of the HB grains relax to the uniaxial easy axis direction that has a smaller angle to the longitudinal direction. HB initialization preferably occurs after a top shield 45 has been formed. For HB grains grown along the sidewall 43, the magnetization will be in the direction along the easy axis direction but pointing toward the sidewall. Therefore, the charges (not shown) from the HB layer 23 are mainly surface charges from these edge grains inside region 46. This charge placement is actually the best situation for generating a strong HB field in the sensor 38 and free layer therein because the charges are at the closest position to the sidewall 43 and the solid angle (not shown) from the charges is maximized. In particular, a seed layer/PMA multilayer hard bias layer of the present invention is advantageous in providing a high Hc and high Mst at a lower cost than conventional HB layers that typically contain Pt.

There is a capping layer 27 formed on the hard bias layer 23 except along a top surface 23s that is coplanar with top surface 38s of the sensor stack. A conformal gap layer 44 made of a dielectric material may be formed on the capping layer, top surface 23s, and top surface 38s in order to separate the sensor and hard bias structure from the top shield 45. Since a sensor stack is more sensitive to high temperature treatments than MRAM or MAMR structures, the annealing temperature after capping layer 27 is formed is preferably maintained in a lower temperature range between 180° C. and 250° C. for 0.5 to 5 hours. Those skilled in the art will appreciate that the hard bias structure comprised of seed layer 22 and hard bias layer 23 may be employed in other hard bias stabilization designs other than the one shown in FIG. 4.

Figure 5:
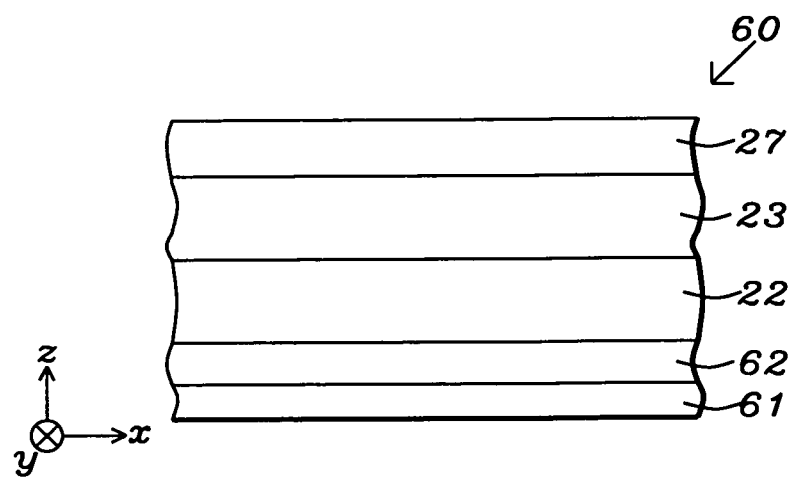
FIG. 5 is a cross-sectional view of seed layer/PMA multilayer stack that is formed as part of a magnetic medium according to a fourth embodiment of the present invention.

Referring to FIG. 5, a seed layer/PMA multilayer as defined herein is incorporated in a perpendicular magnetic medium used in magnetic recording and data storage according to a fourth embodiment of the present invention. In the exemplary embodiment, the perpendicular magnetic medium 60 includes a substrate 61 upon which a soft underlayer material 62, composite seed layer 22, PMA multilayer 23, and a capping layer 27 are sequentially formed. It should be understood that the present invention also encompasses other perpendicular magnetic media designs but a key feature is the seed layer 22/PMA multilayer 23/capping layer 27 stack that provide an excellent Hk above 20000 Oe, Hc>3000 Oe, Ku greater than $5 \times 10^6$ erg/cc, and an adjustable Mrt with acceptable intergranular exchange coupling.

In one aspect, the Ti thickness in a composite Ta/Ti/Cu seed layer 22 may be increased to as high as 100 Angstroms to provide a larger Hc than in MAMR, MRAM, and hard bias embodiments. Additionally, the PMA multilayer 23 which is comprised of $(Co/Ni)_X$, $(Co_{(100-Z)}Fe_Z/Ni)_X$, $(CoFe/NiFe)_X$, $(Co/NiFe)_X$, $(Co/NiCo)_X$, or $(CoFe/NiCo)_X$ may have a larger x of from 20 to 60 than in previous embodiments. The capping layer 27 may be made of Ru/Ta/Ru but other capping layer materials used in the art are also acceptable. After all of the layers in perpendicular magnetic medium 60 are laid down, an annealing process may be performed and comprises a temperature of from 180° C. to 400° C., and preferably between 200° C. and 360° C., for a period of 2 to 5 hours.

Example 1

Figure 6:
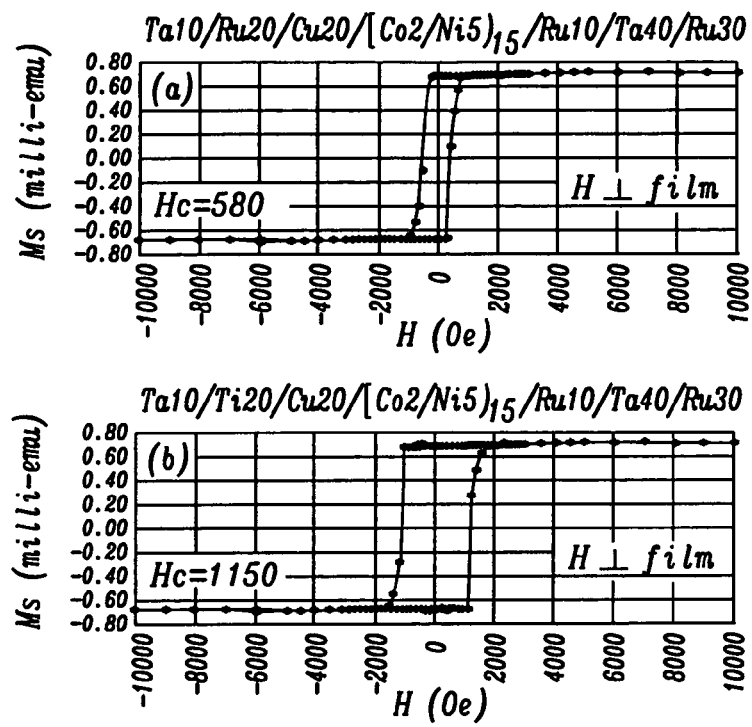
FIG. 6 shows MH curves that demonstrate a substantial increase in Hc when Ta/Ru/Cu is replaced by Ta/Ti/Cu as a seed layer for a $(Co/Ni)_X$ multilayer stack.

An experiment was performed to demonstrate the improvement in PMA magnitude and Hc when a Ta/Ru/Cu composite seed layer is replaced by a Ta/Ti/Cu composite seed layer as described previously with regard to various embodiments of the present invention. For a reference sample, a partial spin valve stack comprised of a composite Ta10/Ru20/Cu20 seed layer, a $(Co/Ni)_{15}$ laminated layer where each Co layer is 2 Angstroms thick and each Ni layer is 5 Angstroms thick, and a Ru10/Ta40/Ru30 cap layer was fabricated in order to obtain PMA values from MH curves using a vibrating sample magnetometer (VSM). The thickness of each layer in the composite seed layer and in the composite cap layer is shown by the number following each of the elements. A second sample was prepared by replacing the Ta/Ru/Cu seed layer in the reference with a Ta10/Ta20/Cu20 seed layer according to an embodiment of the present invention. Each sample was annealed for 2 hours at 220° C. FIG. 6 shows the perpendicular magnetic anisotropy (PMA) component of the magnetic field (Hc) measured for the two samples. Results indicate that Hc may be increased from 580 Oe for the reference (graph a) to 1150 Oe for the sample with a Ta/Ti/Cu seed layer (graph b). Likewise, higher Hk (not shown) is obtained for the sample with a Ta/Ti/Cu seed layer.

Example 2

Figure 7:
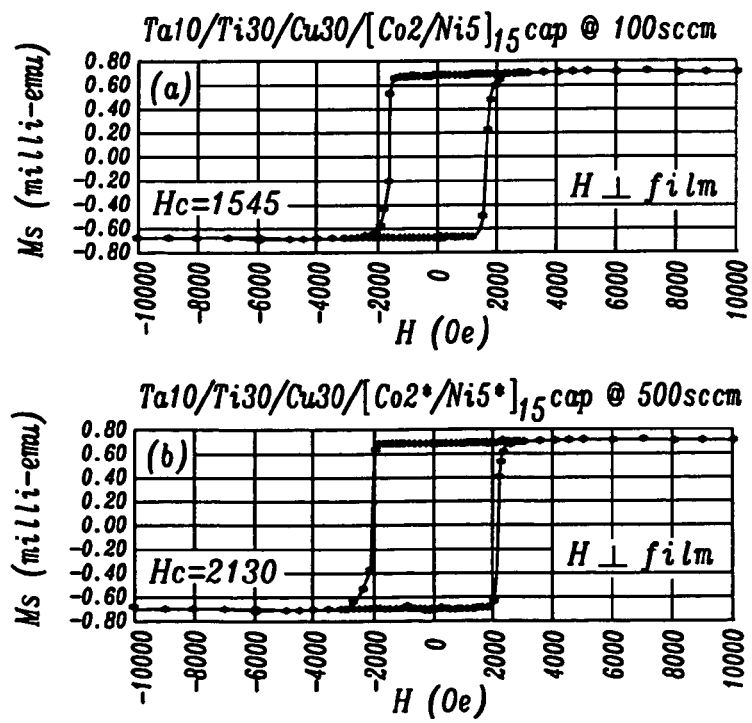
FIG. 7 shows MH curves which demonstrate a significant increase in Hc when a higher pressure $(Co/Ni)_X$ deposition process is employed at low power according to an embodiment of the present invention.

In a second experiment, partial spin valve stacks with a seed layer/PMA multilayer/capping layer configuration were fabricated to demonstrate the enhanced Hc realized when an ultra high gas pressure is utilized during deposition of a $(Co/Ni)_X$ multilayer according to a method of the present invention. As a reference, a stack represented by Ta10/Ti30/Cu30/(Co2/Ni5)$_{15}$/Ru10/Ta40/Ru30 was prepared in which the Co and Ni layers were deposited using an Ar flow rate of 100 sccm. A second stack having the same composition was prepared with an ultra high Ar flow rate of 500 sccm. Data in FIG. 7 (graph a) shows Hc=1545 Oe for the perpendicular magnetic field of the reference stack after annealing at 220° C. for 5 hours. In comparison, FIG. 7 (graph b) shows Hc=2130 Oe after the same annealing conditions for the second stack made with ultra high pressure.

Example 3

Figure 8:
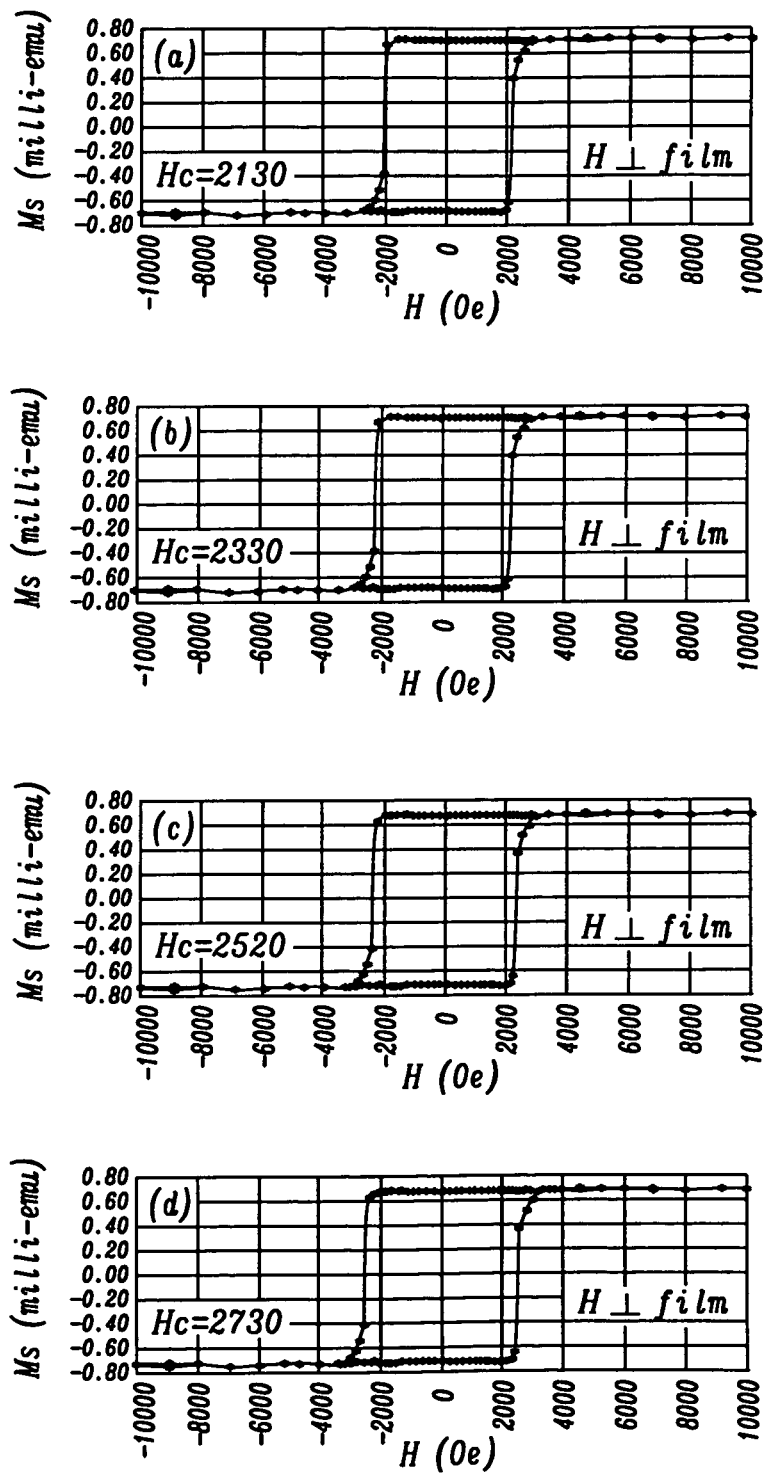
FIG. 8 shows MH curves demonstrating that a plasma treatment and/or oxidation may be used to modify a seed layer surface to increase the Hc value of a subsequently deposited $(Co/Ni)_X$ multilayer according to a method of the present invention.

In a third experiment, the effect of treating a Ta/Ti/Cu seed layer with a PT or NOX process as described earlier is demonstrated. The partial spin valve stack prepared with ultra high pressure in FIG. 7 (b) and FIG. 8 (a) serves as the reference sample and has a composition represented by Ta10/Ti30/Cu30/(Co2/Ni5)$_{15}$/Ru10/Ta40/Ru30 in which the seed layer is not treated prior to depositing the $(Co/Ni)_X$ multilayer. In a second sample represented by Ta10/Ti30/Cu30/PT/(Co2/Ni5)$_{15}$/Ru10/Ta40/Ru30, the composite seed layer is subjected to a plasma treatment involving 20 Watts power, 50 sccm Ar for 50 seconds to form a smoother seed layer surface before the (Co/Ni)$_{15}$ multilayer and capping layer are deposited. A third sample represented by Ta10/Ti30/Cu30/OSL/(Co2/Ni5)$_{15}$/Ru10/Ta40/Ru30 was prepared by performing a NOX process (0.08 sccm oxygen flow rate for 50 seconds) on a Ta10/Ti30/Cu30 seed layer before depositing a (Co/Ni)$_{15}$ multilayer and capping layer. A fourth sample represented by Ta10/Ti30/Cu30/PT/OSL/(Co2/Ni5)$_{15}$/Ru10/Ta40/Ru30 was prepared by subjecting the Ta/Ti30/Cu30 seed layer to a PT process (20 W, 50 sccm Ar, 50 sec.) followed by a NOX process (0.08 sccm O$_2$ for 50 sec.) before depositing a (Co/Ni)$_{15}$ multilayer and capping layer at high pressure conditions. All samples were annealed at 220° C. for 5 hours. Results for the second sample in FIG. 8 (graph b), third sample in FIG. 8 (graph c), and fourth sample in FIG. 8 (graph d) indicate an increase in Hc to 2330 Oe, 2520 Oe, and 2730 Oe, respectively, compared with Hc=2130 Oe for the reference. Thus, subjecting a Ta/Ti/Cu seed layer to either a PT process or a NOX process enhances Hc in the spin valve stack but a sequence of a PT process followed by a NOX process provides the largest benefit in improved performance.

Example 4

Figure 9:
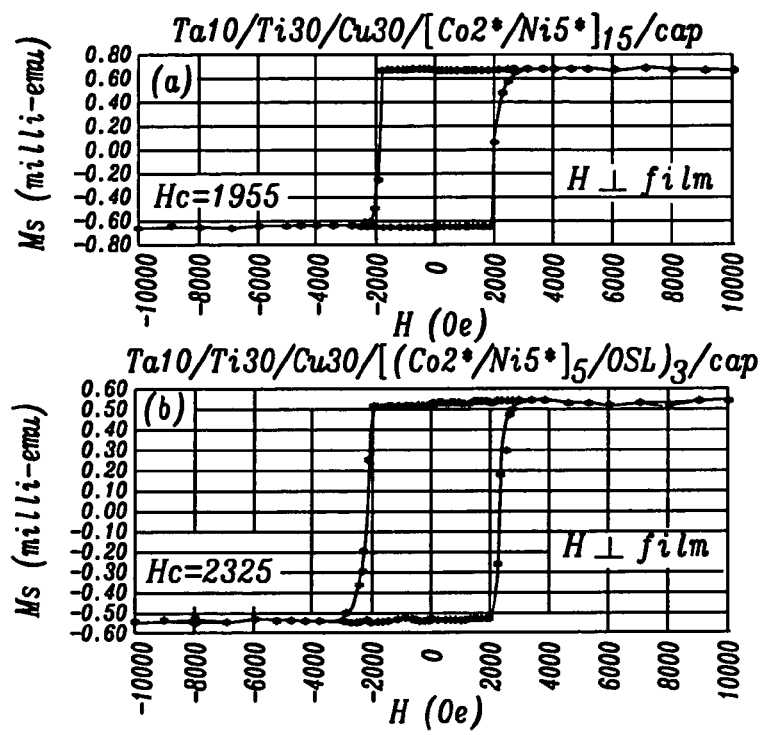
FIG. 9 depicts MH curves that indicate the formation of an oxygen surfactant layer within a $(Co/Ni)_X$ multilayer stack increases the Hc value therein according to a method of the present invention.

Referring to FIG. 9, a fourth experiment was performed to demonstrate the benefit of forming one or more surfactant layers in a PMA multilayer comprised of (Co/Ni)$_X$ or the like. A partial spin valve stack represented by Ta10/Ti30/Cu20/[Co*2/Ni*5]$_{15}$/Ru10/Ta40/Ru30 was prepared as a reference sample in which the asterisk (*) next to the Co and Ni layers indicates they were deposited using an ultra high pressure condition (500 sccm Ar). A second sample represented by Ta10/Ti30/Cu20/{[Co*2/Ni*5]$_5$/OSL}$_3$/Ru10/Ta40/Ru30 was prepared wherein five (Co/Ni) layers were deposited followed by an NOX process to form an OSL, and then the sequence of (Co/Ni)$_5$ deposition followed by an NOX process was repeated twice prior to forming the capping layer. Both samples were annealed at 220° C. for 5 hours and then the MH curves were generated. FIG. 9 (graph b) shows that Hc is increased to 2325 Oe in the second sample compared with the reference (Hc=1955 Oe) because of OSL formation to provide a smoother interface between adjoining (Co/Ni) layers according to a method of the present invention.

Example 5

Figure 10:
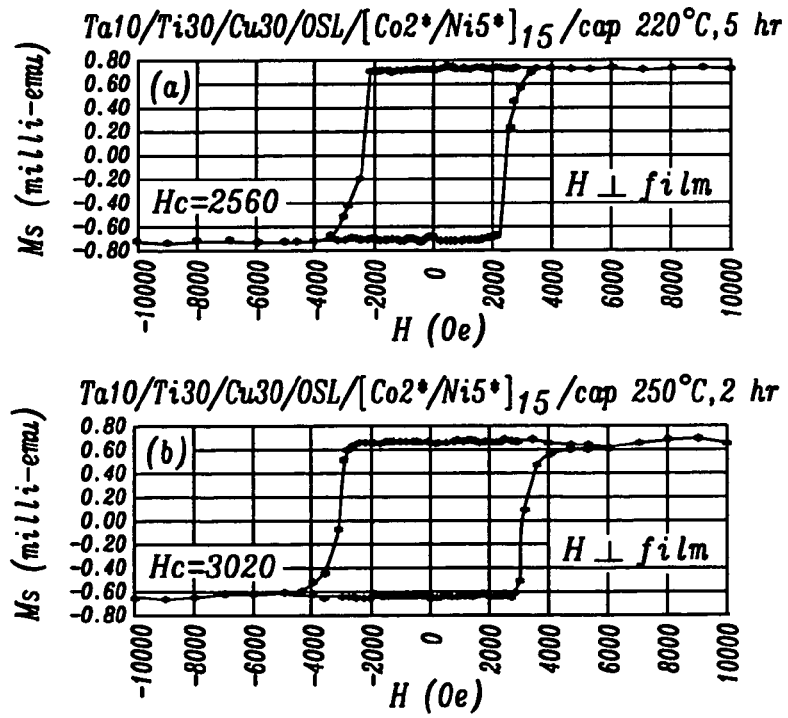
FIG. 10 depicts MH curves that indicate increasing the annealing temperature of a seed layer/$(Co/Ni)_X$ multilayer stack increases the Hc value according to a method of the present invention.

Referring to FIG. 10, a fifth experiment was performed to demonstrate the benefit of a higher annealing temperature for a spin valve stack comprised of a seed layer/PMA multilayer of the present invention. Note that an annealing temperature greater than 220° C. may not be applicable in some magnetic devices such as sensors since one or more components may be damaged by high temperature excursions. However, whenever possible, we have found that increasing the annealing temperature also enhances Hc in PMA multilayers of the present invention. Partial spin valve stacks represented by Ta10/Ti30/Cu30/OSL[Co*2/Ni*5]$_{15}$/Ru10/Ta40/Ru30 were prepared in which the asterisk (*) next to the Co and Ni layers indicates they were deposited using an ultra high pressure condition (500 sccm Ar). A first reference sample was annealed at 220° C. for 5 hours, and a second sample was annealed at 250° C. for 2 hours. MH curves indicate that Hc is increased to 3020 Oe (graph b) in the second sample compared with a reference sample (Hc=2560 Oe) by raising the anneal temperature 30 degrees C. In some cases, an annealing temperature in the range of 280° C. to 350° C. may be employed and then Hc is expected to be substantially greater than the Hc obtained at a 250° C. annealing condition.

It should be understood that the largest gain in Hc may be accomplished by a combination of all the process and structure modifications as described in the present invention which are the following: (1) PT and NOX treatment of a seed layer that is preferably Ta/Ti/Cu; (2) formation of a (Co/Ni)$_X$ multilayer or the like on the seed layer using ultra high pressure; (3) including at least one OSL in the (Co/Ni)$_X$ multilayer; and (4) employing a high annealing temperature that does not compromise the reliability of device components. By taking advantage of one or more embodiments of the present invention, PMA and Hc may be increased to higher values than in the prior art while keeping material cost less than that of expensive (Co/Pt)$_Y$ and (Co/Pd)$_Y$ systems. All processes may be performed in existing manufacturing equipment with no interruption in process flow. As a result, the seed layer/PMA multilayer structure disclosed herein and associated process improvements may be readily implemented in current manufacturing schemes and will enable magnetic recording technology to be advanced at a faster pace because of enhanced performance.

While this invention has been particularly shown and described with reference to, the preferred embodiment thereof, it will be understood by those skilled in the art that various changes in form and details may be made without departing from the spirit and scope of this invention.

We claim:

1. A microwave assisted magnetic recording (MAMR) structure, comprising:
   (a) a composite seed layer formed on a substrate and having a Ta/M1/M2 configuration where M1 is a metal or alloy having a fcc(111) or (hcp) hexagonal closed packed (001) crystal orientation, and M2 is a metal unequal to M1, said composite seed layer forms an interface with an overlying spin injection layer;
   (b) the spin injection layer (SIL) comprised of a laminated structure with perpendicular magnetic anisotropy (PMA) represented by (CoFe/Ni)$_X$, (CoFeR/Ni)$_X$, (Co/NiFe)$_X$, (Co/NiCo)$_X$, (CoFe/NiFe)$_X$, or (CoFe/NiCo)$_X$ where x is between 5 and 50 and R is Ru, Rh, Pd, Ti, Zr, Hf, Ni, Cr, Mg, Mn, or Cu, a CoFe, CoFeR, or Co layer has a lesser thickness than a Ni, NiFe, or NiCo layer, and an interface is formed between each pair of adjoining layers in the laminated structure; and
   (c) an oxygen surfactant layer consisting of oxygen formed at the interface between the composite seed layer and SIL, and/or at one or more interfaces in the SIL.

2. The MAMR structure of claim 1 further comprised of an interfacial layer, a non-magnetic spacer, a field generation layer (FGL) and a capping layer sequentially formed on the SIL.

3. The MAMR structure of claim 2 wherein the non-magnetic spacer is comprised of Cu to give a GMR configuration, or is made of MgO, AlOx, ZnO, or TiOx to give a TMR configuration, the interfacial layer is one of CoFeB, CoFe/CoFeB, or CoFeB/CoFe, and the FGL is comprised of FeCo.

4. The MAMR structure of claim 1 wherein M1 is Ti, M2 is Cu, and each of Ta, Ti, and Cu have a thickness between about 5 and 50 Angstroms.

5. The MAMR structure of claim 1 wherein the oxygen surfactant layer between the composite seed layer and SIL, and/or at one or more interfaces in the SIL consists of oxygen with a thickness less than or equal to about one atomic layer that is formed by a natural oxidation process with an oxygen flow.

6. A magnetic random access memory (MRAM) structure, comprising:
   (a) a composite seed layer formed on a substrate and having a Ta/M1/M2 configuration where M1 is a metal or alloy having a fcc(111) or (hcp) hexagonal closed packed (001) crystal orientation, and M2 is a metal unequal to M1, said composite seed layer forms an interface with an overlying reference layer;
   (b) the reference layer comprised of a laminated structure with perpendicular magnetic anisotropy represented by (CoFe/Ni)$_X$, (CoFeR/Ni)$_X$, (Co/NiFe)$_X$, (Co/NiCo)$_X$, (CoFe/NiFe)$_X$, or (CoFe/NiCo)$_X$ where x is between 5 and 30 and R is Ru, Rh, Pd, Ti, Zr, Hf, Ni, Cr, Mg, Mn, or Cu, a CoFe, CoFeR, or Co layer has a lesser thickness than a Ni, NiFe, or NiCo layer, and an interface is formed between each pair of adjoining layers in the laminated structure; and (c) an oxygen surfactant layer consisting of oxygen formed at the interface between the composite seed layer and reference layer, and/or at one or more interfaces in the reference layer.

7. The MRAM structure of claim 6 further comprised of a first interfacial layer, a tunnel barrier layer, a second interfacial layer, a free layer, and a capping layer sequentially formed on the reference layer.

8. The MRAM structure of claim 7 wherein the tunnel barrier layer is made of MgO, AlOx, ZnO, or TiOx, and the first and second interfacial layers are comprised of CoFeB, CoFe/CoFeB, or CoFeB/CoFe.

9. The MRAM structure of claim 7 wherein the free layer is comprised of a laminated structure represented by (CoFe/Ni)$_S$, (CoFeR/Ni)$_S$, (Co/NiFe)$_S$, (Co/NiCo)$_S$, (CoFe/NiFe)$_S$, or (CoFe/NiCo)$_S$ where s is between 3 and 10, and a CoFe, CoFeR, or Co layer has a lesser thickness than a Ni, NiFe, or NiCo layer in said free layer.

10. The MRAM structure of claim 6 wherein M1 is Ti, M2 is Cu, and each of Ta, Ti, and Cu have a thickness between about 5 and 50 Angstroms.

11. The MRAM structure of claim 6 wherein the oxygen surfactant layer between the composite seed layer and reference layer, and/or at one or more interfaces in the reference layer consists of oxygen with a thickness less than or equal to about one atomic layer that is formed from a natural oxidation process with an oxygen flow.

\* \* \* \* \*